United States Patent [19]
Smith et al.

[11] Patent Number: 5,844,298
[45] Date of Patent: Dec. 1, 1998

[54] METHOD AND APPARATUS FOR PROGRAMMING ANTI-FUSES

[75] Inventors: Eric J. Smith; Joseph C. Sher, both of Boise, Id.

[73] Assignee: Micron Technology, Inc., Boise, Id.

[21] Appl. No.: 828,364

[22] Filed: Mar. 28, 1997

[51] Int. Cl.$^6$ .................................................. H01L 29/00
[52] U.S. Cl. .............................. 257/530; 257/50; 365/96; 365/225.7
[58] Field of Search ........................ 257/50, 530; 365/96, 365/225.7

[56] References Cited

U.S. PATENT DOCUMENTS

| | | | |
|---|---|---|---|
| 5,495,436 | 2/1996 | Callahan | 365/96 |
| 5,600,277 | 2/1997 | Koelling | 327/526 |
| 5,663,679 | 9/1997 | Manning | 327/567 |

*Primary Examiner*—David C. Nelms
*Assistant Examiner*—Hoai V. Ho
*Attorney, Agent, or Firm*—Seed & Berry LLP

[57] ABSTRACT

A programming circuit programs an anti-fuse having first and second terminals with the programming circuit and the anti-fuse being fabricated in the same integrated circuit. The programming circuit includes a first external terminal of the integrated circuit coupled to the first terminal of the anti-fuse. The first external terminal is adapted to receive a first programming voltage having a predetermined polarity. A second external terminal of the integrated circuit is adapted to receive a second programming voltage having a polarity opposite that of the first programming voltage. A voltage translation circuit is coupled between the second external terminal and the second terminal of the anti-fuse and includes an enable terminal adapted to receive an enable signal. The voltage translation circuit is operable to couple the second programming voltage to the second terminal of the anti-fuse in response to the enable signal being active. When the enable signal is inactive, the voltage translation circuit isolates both positive and negative voltages on the second external terminal from the second terminal of the anti-fuse.

23 Claims, 5 Drawing Sheets

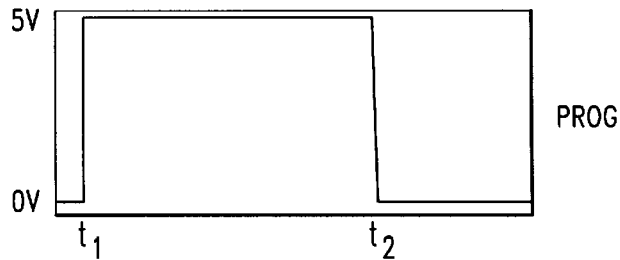
Fig. 3A    PROG
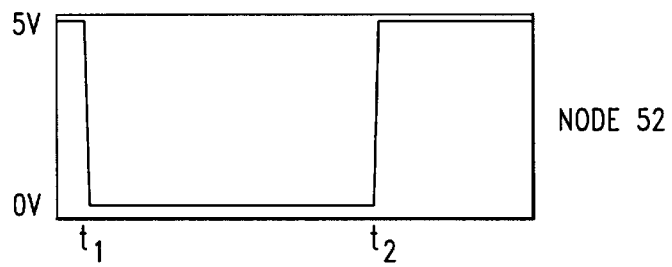
Fig. 3B    NODE 52
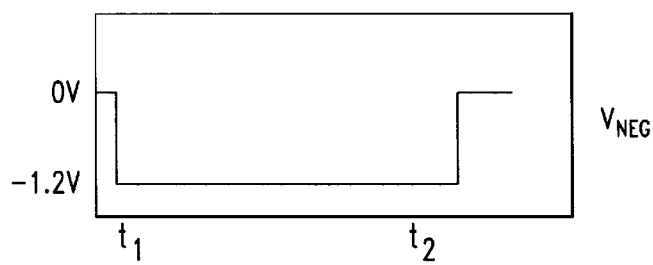
Fig. 3C    $V_{NEG}$
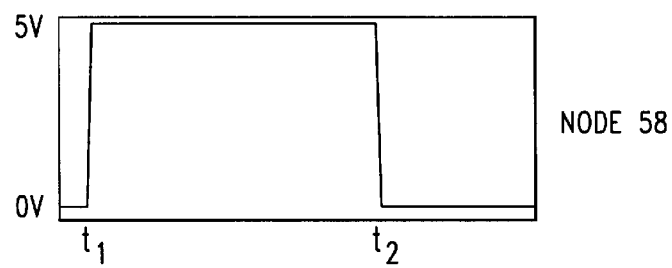
Fig. 3D    NODE 58
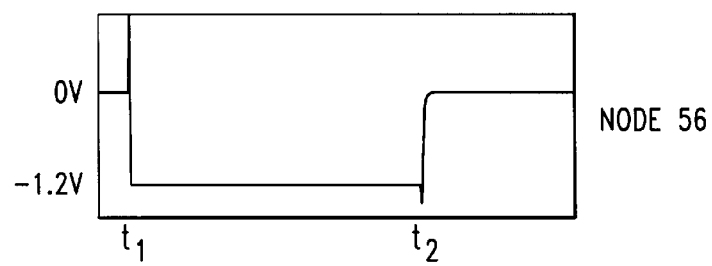
Fig. 3E    NODE 56
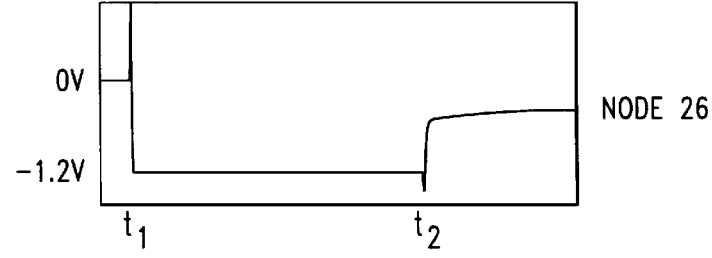
Fig. 3F    NODE 26

METHOD AND APPARATUS FOR PROGRAMMING ANTI-FUSES

TECHNICAL FIELD

The present invention relates generally to programming anti-fuses in semiconductor circuits, and, more particularly, to a method and apparatus for programming anti-fuses with a sufficiently high voltage to provide a consistently low resistance of the programmed anti-fuse without overstressing other components of the integrated circuit and for isolating the anti-fuses from undesirable external voltages to prevent inadvertent programming of the anti-fuses.

BACKGROUND OF THE INVENTION

Anti-fuses are a common component in conventional integrated circuits. An anti-fuse is a circuit element that is normally open circuited until it is programmed, at which point the anti-fuse assumes a relatively low resistance. Anti-fuses are commonly used to selectively enable certain features of integrated circuits and to perform back end repairs of integrated circuits, i.e., repairs after the integrated circuit has been packaged. Back end repairs of integrated circuits are typically accomplished by "blowing" anti-fuses to signal defective portions of the integrated circuit that they should be replaced with redundant circuits. For example, a defective row of memory cells in the array of a dynamic random access memory can be replaced with a redundant row of cells provided for that purpose.

Conventional anti-fuses are similar in construction to capacitors in that they include a pair of conductive plates separated from each other by a dielectric or insulator. Anti-fuses are typically characterized by the nature of the dielectric which may be, for example, oxide or nitride. Anti-fuses are programmed or "blown" by applying a differential voltage between the plates that is sufficient to break down the dielectric thereby causing the plates to contact each other. Typically this relatively high programming voltage is applied to the chip externally through terminals that are normally used for other purposes. For example, in a DRAM, a high voltage may be applied to one of the data bit terminals after the integrated circuit has been placed in a programming mode by, for example, applying a predetermined combination of bits to other terminals of the integrated circuit.

Although conventional anti-fuses as described above have worked well in many applications, they nevertheless have several shortcomings, particularly when used in more recent, high density integrated circuits. In particular, the programmed resistance of anti-fuses may vary over a considerable range, and the programmed resistance is often far higher than is desired. For example, sometimes the programmed resistance is high enough that circuitry connected to the anti-fuse mistakenly determines that the anti-fuse is open circuited. It is generally known that programming anti-fuses with a higher voltage will both lower the programmed resistance and provide a more uniform resistance. However, the magnitude of the programming voltage that can be applied to anti-fuses is severely limited by the presence of other circuitry in the integrated circuit. In particular, since the terminals on which the programming voltage is applied are typically used for other functions, excessive programming voltages can easily break down the gate oxide layers of MOSFETs connected to such terminals thereby making such transistors defective. If the programming voltage was coupled to the integrated circuit substrate, excessive voltages could still be coupled across the gate oxide layers of MOSFETs, even though the programming voltage was not applied directly to the gates of the transistors. The problem of programming voltages breaking down the gate oxide layer of MOSFETs is exacerbated by the wide range of operating voltages of typical integrated circuits. For example, recent integrated circuits are capable of operating with a supply voltage of 3.3 volts in order to minimize power consumption, but they must still be able to operate with a commonly used supply voltage of 5 volts.

A schematic block diagram of a conventional anti-fuse programming circuit 10 is illustrated in FIG. 1. The circuit 10 is connected to a plurality of anti-fuses 12, each having a first terminal coupled to a node 14 and a second terminal coupled to a node 16 through an associated selection transistor 18. The gate of each selection transistor 18 is connected to a selection input SELN provided by circuitry (not shown) that selects the anti-fuse 12 to be programmed. A transistor 20 operates to couple the node 16 to ground when circuitry (not shown) drives a program input PROG active. The program input PROG is also coupled to the gate of a transistor 22 which operates to couple a programming voltage $V_{POS}$ received on an external terminal 23 to the node 14. The voltage $V_{POS}$ is typically coupled to an external terminal of an integrated circuit containing the programming circuit 10 and anti-fuse 12.

When an anti-fuse 12 is to be programmed, the voltage $V_{POS}$ is applied to terminal 23 and the program input PROG is driven active to turn ON the transistors 20 and 22 and thereby couple the node 16 to ground and the programming voltage $V_{POS}$ to the node 14, respectively. The appropriate select input SEL N is then driven active to turn ON the associated selection transistor 18 and thereby couple the second terminal of the selected anti-fuse 12 to ground through the transistor 20. At this point, a substantial portion of the programming voltage $V_{POS}$ is applied across the selected anti-fuse 12 to "blow" or program the anti-fuse and cause it to have a relatively low resistance value. However, the full magnitude of the programming voltage $V_{POS}$ is not applied to the selected anti-fuse 12 unless the magnitude of the PROG signal is greater than the voltage $V_{POS}$ by the threshold voltage $V_T$ of the transistor 22. Furthermore, the voltage applied to the selected anti-fuse 12 cannot be increased by simply increasing $V_{POS}$ since the voltage applied to the anti-fuse 12 is limited to the magnitude of the PROG signal less the threshold voltage $V_T$. Also, since the magnitudes of $V_{POS}$ and PROG must be increased by $V_T$ to compensate for the voltage drop between the drain and source of the transistor 22, the risk of excessively stressing internal components is further increased.

The magnitude of the programming voltage applied to the anti-fuse 12 must be sufficient to adequately blow the anti-fuse 12 so that it consistently has a low resistance value. In practice, however, the resistance values of blown anti-fuses 12 varies considerably from one fuse to another. This is problematic because an anti-fuse 12 which has not been sufficiently "blown" may be interpreted as being an open circuit, and may thus cause improper operation of other circuitry whose operation depends on the state of the anti-fuse. One way to more consistently program the anti-fuses 12 is to increase the programming voltage $V_{POS}$ and/or the magnitude of the PROG signal. This approach is limited, however, because the use of larger voltages could easily overstress MOSFETs and exceed the breakdown voltage of bipolar electrostatic discharge protection transistors on the integrated circuit on which the programming circuit 10 and anti-fuses 12 are fabricated.

In addition to consistently programming the anti-fuses 12, the programming circuit 10 must also provide adequate isolation between the external terminal 23 and the anti-fuses so that inadvertent programming of the fuses does not result from noise on the external terminal. Noise signals having both positive and negative amplitudes must be isolated by the circuit 10 in order to optimally protect inadvertent programming of the anti-fuses 12.

There is a need for a circuit for programming an anti-fuse which applies the full magnitude of an external voltage across the anti-fuse sufficient to consistently program the fuse and cause it to have a low resistance value, and which also isolates the anti-fuse so that noise present in the integrated circuit does not result in inadvertent programming of the anti-fuse.

SUMMARY OF THE INVENTION

A programming circuit programs an anti-fuse having first and second terminals where the programming circuit and the anti-fuse are fabricated in the same integrated circuit. The programming circuit includes a first external terminal of the integrated circuit coupled to the first terminal of the anti-fuse. The first external terminal is adapted to receive a first programming voltage having a predetermined polarity. A second external terminal of the integrated circuit is adapted to receive a second programming voltage having a polarity opposite that of the first programming voltage. A voltage translation circuit is coupled between the second external terminal and the second terminal of the anti-fuse and includes an enable terminal adapted to receive an enable signal. The voltage translation circuit is operable to couple the second programming voltage to the second terminal of the anti-fuse in response to the enable signal being active. When the enable signal is inactive, the voltage translation circuit isolates both positive and negative voltages on the second external terminal from the second terminal of the anti-fuse to thereby prevent inadvertent programming of the anti-fuse.

BRIEF DESCRIPTION OF THE DRAWINGS

FIGS. 3A–3F are signal timing diagrams illustrating the signals at various nodes of the negative voltage translator circuit of FIG. 2.

DETAILED DESCRIPTION OF THE INVENTION

Figure 1:
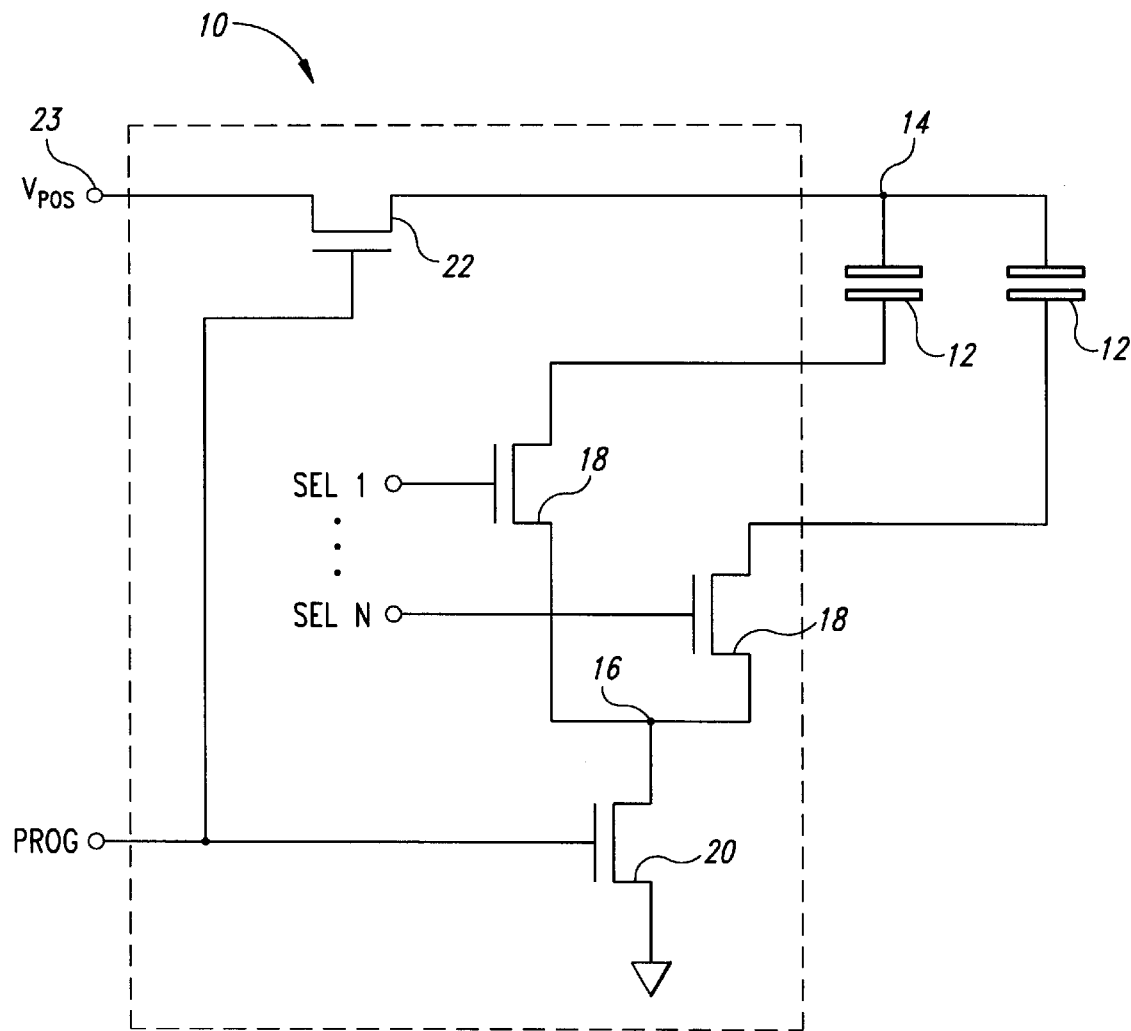
FIG. 1 is a schematic block diagram of a prior art circuit for programming anti-fuses.
Figure 2:
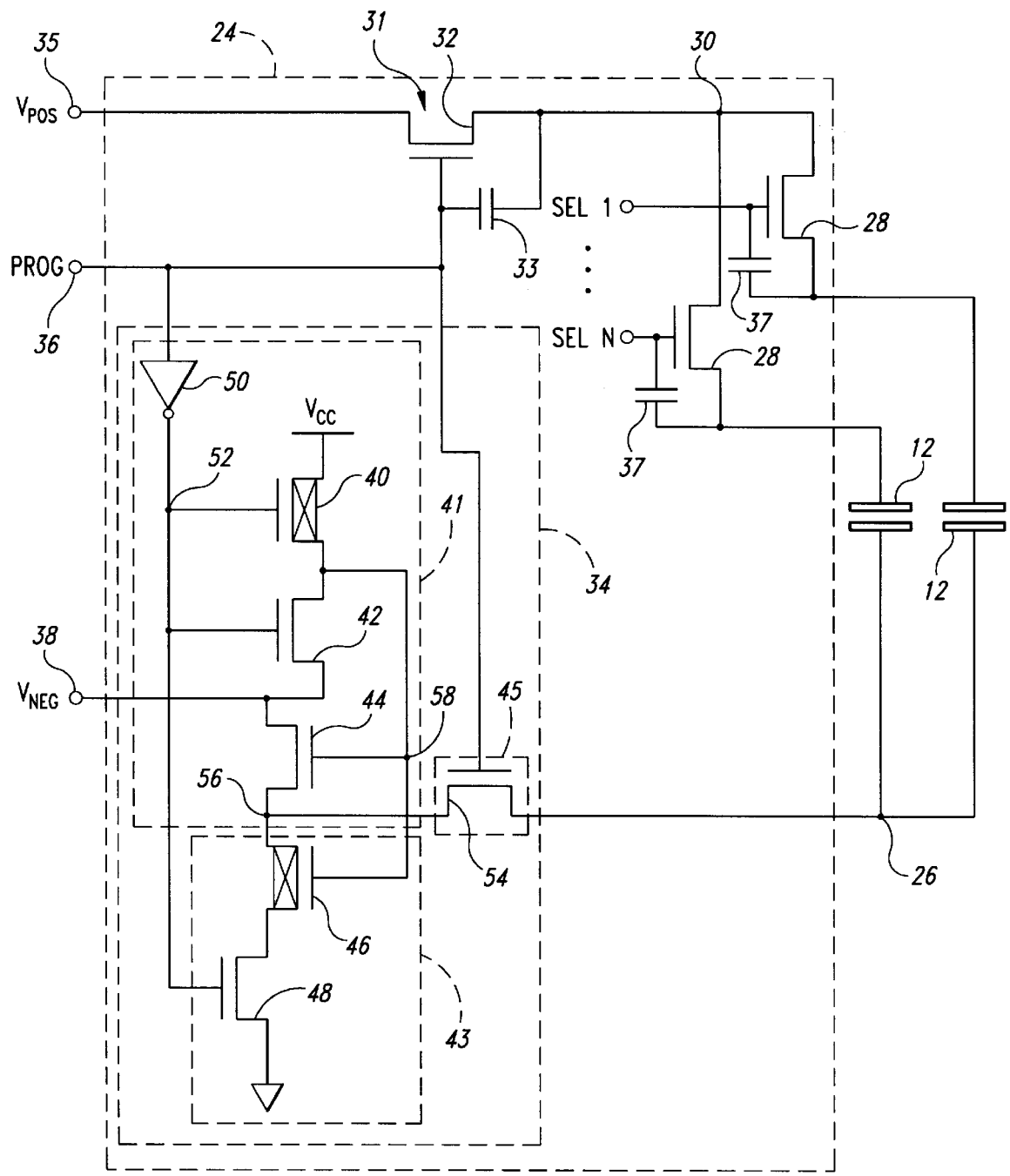
FIG. 2 is a schematic block diagram of one embodiment of a circuit for programming anti-fuses in accordance with the present invention.

One embodiment of an anti-fuse programming circuit 24 according to the present invention is illustrated in FIG. 2. As with the prior art programming circuit 10 described with reference to FIG. 1, a plurality of anti-fuses 12 are connected to the circuit 24. Specifically, the anti-fuses 12 each have a first terminal connected to a node 26 of the programming circuit 24 and a second terminal coupled through respective selection transistors 28 to a node 30. The circuit 24 further includes a switch circuit 31 formed by an NMOS transistor 32 and a bootstrap capacitor 33 which receives a relatively large positive programming voltage $V_{POS}$ on a terminal 35 and, when enabled, couples that voltage to the node 30.

Typically, the terminal 35 is an external terminal of the integrated circuit containing the circuit 24 and anti-fuses 12. The switch circuit 32 is enabled or disabled by a program input PROG received on a terminal 36 which is coupled to the gate of the transistor 32. When the transistor 32 begins to conduct, the resulting increase in voltage at its source is coupled to the gate through the bootstrap capacitor 33. As a result, the voltage at the gate rises above $V_{POS}$ so that there is no voltage drop between the drain and the source of the transistor 32. For the same reason, respective bootstrap capacitors 37 are connected between the gate and the source of the selection transistors 28. Thus, the full magnitude of the programming voltage $V_{POS}$ is applied to the selected anti-fuse 12. However, it will be understood that the bootstrap capacitors 33, 37 are not required if voltage drops across the transistors 32, 28 can be tolerated. While the switch circuit 31 is shown as being comprised of merely an NMOS transistor 32 and a boot capacitor 33, other conventional circuits may likewise be used and may be necessary where the positive programming voltage $V_{POS}$ has a relatively large magnitude. In particular, applying the PROG signal to a PMOS transistor (not shown) through an inverter (not shown) would avoid any voltage drop across the switch circuit 32 without the need to use a bootstrap capacitor 33. The programming circuit 24 further includes a negative voltage translator 34 which receives a negative programming voltage $V_{NEG}$ on an external terminal 38 and operates to provide that negative voltage on the node 26 when the program input PROG is active. The negative voltage translator 34 also operates to isolate both positive and negative voltages on the terminal 38 from the node 26 when the program input PROG is inactive, and thereby prevents inadvertent programming of the anti-fuses 12 due to such a positive or negative voltage.

In operation, the program input PROG on terminal 36 is driven active to enable the programming circuit 24. The positive programming voltage $V_{POS}$ and the negative programming voltage $V_{NEG}$ are then applied to the terminals 35 and 28, respectively. In response to the program input PROG going active, the voltages $V_{POS}$ and $V_{NEG}$ are coupled to the nodes 30 and 26, respectively. Other circuitry on the integrated circuit containing the circuit 24 and anti-fuses 12 then provides a select input SEL N to the selection transistor 28 of the anti-fuse 12 to be programmed. When the select input SEL N turns ON its associated selection transistor 28, the voltage $V_{POS}$, now present on node 30, is coupled to one terminal of the associated anti-fuse 12. At this point, the voltage across the anti-fuse 12 being programmed is equal to $V_{POS}-V_{NEG}$ and is of such a magnitude to consistently program the anti-fuse so that it has a low resistance value. Upon completion of the programming of the desired anti-fuse 12, the program input PROG is driven inactive so that the switch circuit 32 and negative voltage translator 34 are disabled and the differential programming voltage removed from the anti-fuse. It should be noted that the sequence of activating the inputs PROG and SEL N and applying voltages $V_{POS}$ and $V_{NEG}$ may be varied with the circuit 24. For example, the input SEL N could be activated, then input PROG activated, and then voltages $V_{POS}$ and $V_{NEG}$ applied to their respective terminals.

A more detailed explanation of the components and operation of the negative voltage translator 34 is now provided. The translator 34 includes a control circuit 41, a reset circuit 43, and a pass circuit 45. The control circuit 41 includes a plurality of transistors 40–44 connected in series as shown between a positive supply voltage $V_{CC}$ and a node 56. An inverter 50 has its input coupled to the terminal 36 and its output coupled to a node 52 which is coupled to the gates of the PMOS transistor 40 and NMOS transistor 42. A node 58 is formed by the interconnection of the gate terminal of the transistor 44 and the drain terminal of the transistor 40. The negative programming voltage $V_{NEG}$ on the terminal 38 is connected to the source terminal of the transistor 42. In operation, as explained in detail below, the control circuit 41 couples the voltage $V_{NEG}$ to the node 56 when the input PROG is active and couples the voltage $V_{NEG}$ to the node 58 when the input PROG is inactive.

The reset circuit 43 includes a PMOS transistor 46 and an NMOS transistor 48 connected between the node 56 and ground as shown. The gates of transistors 46 and 48 are connected to the nodes 58 and 52, respectively. As explained below, the reset circuit 43 operates to drive the node 56 to ground through the transistors 46 and 48 when the input PROG is inactive and to isolate the node 56 from ground when the input PROG is active. The pass circuit 45 includes a pass transistor 54 having its drain terminal connected to the node 56, its source terminal connected to the node 26, and its gate terminal connected to the terminal 36. In operation, as also explained in detail below, the pass circuit 45 couples the node 56 to the node 26 when the input PROG is active.

The translator 34 operates in two basic modes, pass mode and isolation mode, which are characterized by the state of the programming input PROG. In pass mode, the programming input PROG is active and the translator 34 couples the negative programming voltage $V_{NEG}$ on terminal 38 to the node 26. In the embodiment of FIG. 2, the programming input PROG is high when active. When the programming input PROG is active, the node 52 is low which turns OFF transistors 42 and 48 and turns ON transistor 40. When transistor 40 is ON, the supply voltage $V_{CC}$ is coupled through the transistor 40 to the node 58 which turns ON transistor 44 and turns OFF transistor 46. Since the transistor 44 is ON, the negative programming voltage $V_{NEG}$ on terminal 38 is coupled through transistor 44 to node 56. The active program input PROG at the gate of the transistor 54 turns ON that transistor, and the negative programming voltage $V_{NEG}$ on node 56 is thereby coupled through the transistor 54 to the node 26 to be used for programming an anti-fuse 12. From this description, it is seen that in the pass mode of operation the translator 34 operates to couple a voltage applied on an external terminal of the integrated circuit to an internal node of the integrated circuit. Furthermore, since the drain-to-source voltage drop of the transistors 44 and 54 is substantially zero, virtually the full magnitude of $V_{NEG}$ is applied to the anti-fuses 12.

The second mode of operation of the translator 34 is isolation mode, which is characterized by the program input PROG being inactive (low). When the program input PROG is low, the voltage at node 52 is high which thereby turns OFF transistor 40 and turns ON transistors 42 and 48. When the transistor 42 is ON, the voltage $V_{NEG}$ on terminal 38 is coupled through the transistor 42 to the node 58. This negative voltage on node 58 turns OFF the transistor 44 and turns ON transistor 46 which results in node 56 being pulled to ground through transistors 46 and 48, which are now both ON. With the node 56 at ground and the low program input PROG driving the gate of the transistor 54, the transistor 54 is OFF and the voltage $V_{NEG}$ is isolated from the node 26. In the isolation mode of operation, it is seen that the translator 34 isolates whatever voltage is present on the terminal 38 from the node 26 and thereby prevents inadvertent programming of an anti-fuse 12. Both positive and negative voltages are isolated by the translator 34. More specifically, when the voltage of $V_{NEG}$ is negative, the node 58 will also be at $V_{NEG}$ because the transistor 42 will be turned on by the high applied to its gate. As a result, both the source and the gate of the transistor 44 will be at $V_{NEG}$ regardless of the value of $V_{NEG}$. Thus, the transistor 44 will remain OFF to isolate the transistor 54 from $V_{NEG}$, regardless of the magnitude of the negative voltage.

If $V_{NEG}$ is a positive voltage when PROG is inactive (low), the gate of the NMOS transistor 54 is low, thereby turning OFF the transistor 54. Also, because the voltage at node 58 is set by the transistor 42 to the voltage at the output of the inverter 50 less the threshold voltage $V_T$ of the transistor 42, the voltage at the node 58 is significantly lower than a large positive voltage that might be applied to the $V_{NEG}$ input. The voltage on node 58 is further reduced by the threshold voltage $V_T$ of the transistor 44 before being applied to the transistor 54. Thus, the transistor 54 is isolated from any large positive voltage that might be applied to the $V_{NEG}$ terminal.

FIGS. 3A–3F are signal timing diagrams which illustrate the signals on various nodes of the translator 34 during operation. In FIG. 3A, the program input PROG goes high at time $t_1$, indicating the commencement of the pass mode of operation. When the input PROG goes high, the inverter 50 drives the signal on node 52 low, as indicated in FIG. 3B. FIG. 3C depicts the negative programming voltage $V_{NEG}$ on the terminal 38 and illustrates that this voltage would typically assume its desired programming value (in this case, -1.2 volts) slightly before time $t_1$. FIG. 3D depicts the signal at node 58 which goes high at time $t_1$ in response to the transistor 40 turning ON and coupling the voltage $V_{CC}$ to the node 58. FIG. 3E depicts the signal at node 56, which is zero volts before time $t_1$ because it is coupled to ground through transistors 46 and 48. At time $t_1$, the voltage at node 56 is driven to the value of the programming voltage $V_{NEG}$. A slight positive spike in the voltage at node 56 may occur at time $t_1$ as depicted and results from the capacitive coupling of the positive-going signal at the node 58 from the gate of the transistor 44 to the node 56. The voltage on node 56 is coupled through the transistor 54 to node 26 as shown in FIG. 3F, and is thereby provided to the anti-fuses 12 for programming.

The time period from time $t_1$ to time $t_2$ illustrated in FIGS. 3A–3F corresponds to the pass mode of operation of the translator 34. At time $t_2$, the program input PROG goes low, as illustrated in FIG. 3A, which signals the commencement of the isolation mode of operation. In response to the program input PROG going low, the signal on node 52 goes high at time $t_2$ as shown in FIG. 3B. The voltage $V_{NEG}$ is shown in FIG. 3C as going to zero volts slightly after time $t_2$, which merely indicates the end of a programming cycle and one skilled in the art will realize that the voltage on terminal 38 may assume different values at this point. FIG. 3D shows the voltage at node 58 goes low at time $t_2$ in response to the voltage at node 52 going high. At time $t_2$, the signal on node 56 is driven to 0 volts through the transistors 46 and 48 as shown in FIG. 3E. A slight negative voltage spike may occur on node 56 at this time because of the capacitive coupling of the negative-going signal on the node 58 coupled through the transistor 44 to the node 56. The output of the translator 34 on node 26 is illustrated in FIG. 3F as being indeterminate after time $t_2$ which represents the isolation of the node 26 during the isolation mode of operation.

Figure 4:
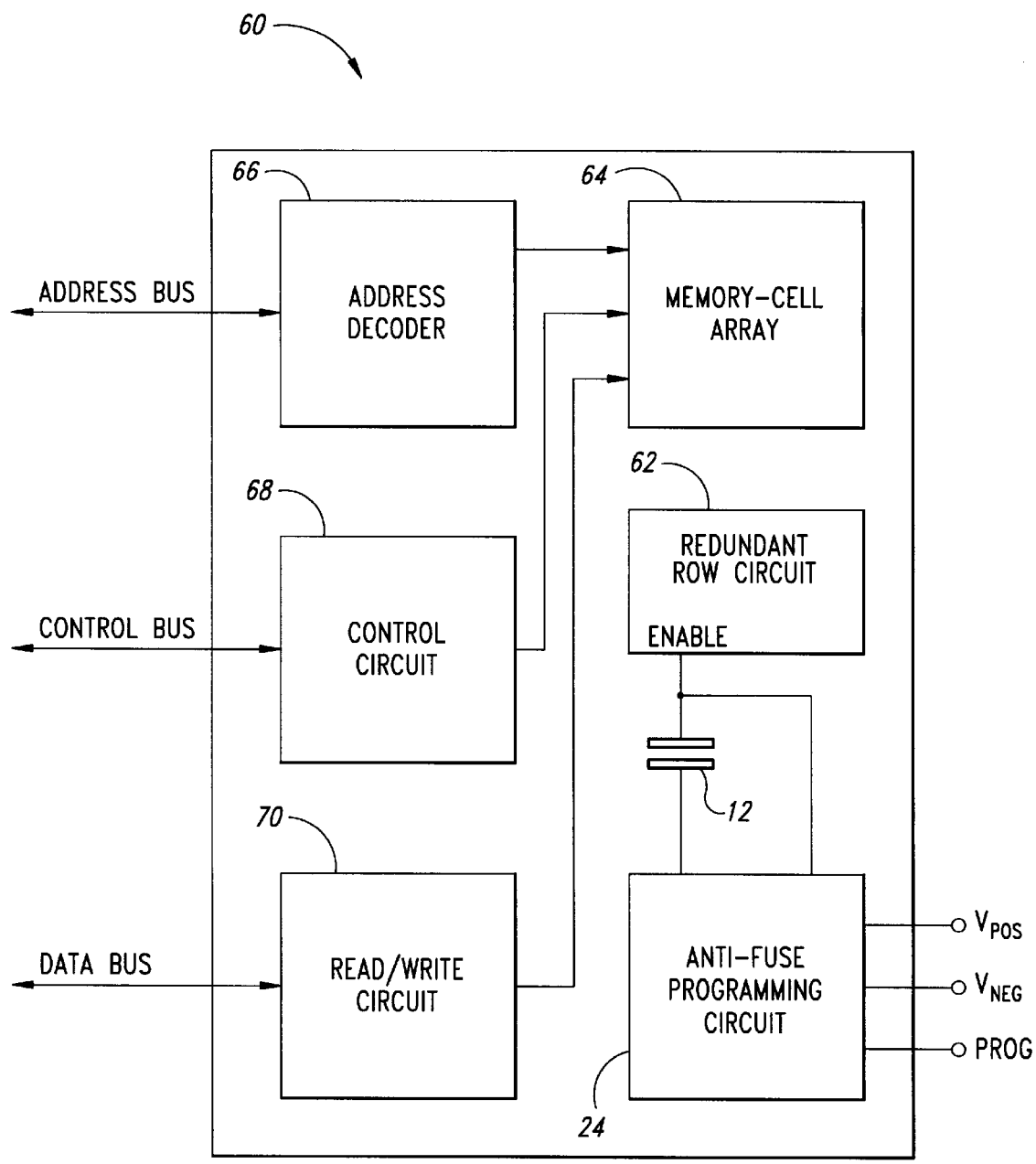
FIG. 4 is a block diagram of a memory device which includes the circuit for programming anti-fuses of FIG. 2.

FIG. 4 is a block diagram of a memory device 60 which includes the anti-fuse programming circuit 24 of FIG. 2. The anti-fuse programming circuit 24 is shown as receiving on external terminals of the memory device 60 programming voltages $V_{POS}$ and $V_{NEG}$, and an input PROG which enables the circuit 24. The input PROG could also be generated internal to the memory device 50 in response to the state of signals on other terminals of the device. The circuit 24 is connected to an anti-fuse 12 as previously described. One terminal of the anti-fuse 12 is connected to an enable terminal ENABLE of a redundant row circuit 62 containing a plurality of redundant memory cells that are used to replace defective memory cells in a memory cell array 64. The memory device 60 further includes an address decoder 66, control circuit 68, and read/write circuitry 70, all of which are conventional. The address decoder 66, control circuit 68, and read/write circuitry 70 are all coupled to the memory cell array 64. In addition, the address decoder 66 is coupled to an address bus, the control circuit 68 is coupled to a control bus, and the read/write circuit 70 is coupled to a data bus.

In operation, external circuitry controls operation of the memory device including the programming circuit 24 to program the desired anti-fuses 12. When the input PROG is inactive, the terminal of the anti-fuse 12 connected to the circuit 24 is at ground so that the redundant row circuit 62 can read the state of the anti-fuse on the terminal ENABLE. When the anti-fuse 12 has been blown, the circuit 62 operates to replace a row of memory cells in the array 64 with redundant memory cells contained within the circuit 62. Operation of the address decoder 66, control circuit 68, and read/write circuit 70 during read and write data transfer operations is conventional and understood by one skilled in the art.

Figure 5:
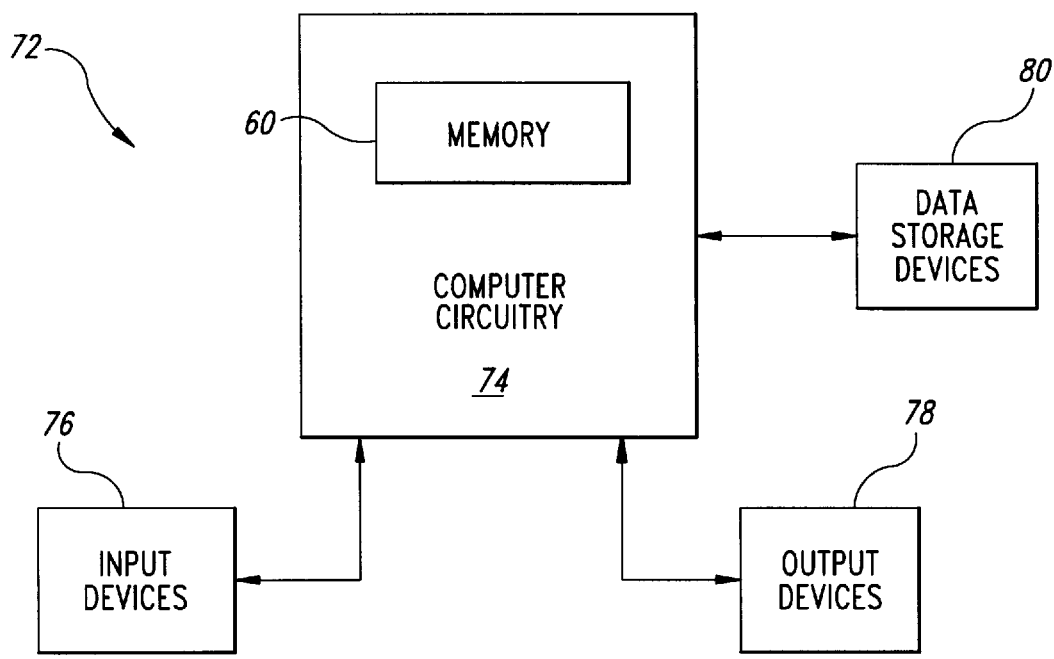
FIG. 5 is a computer system that includes the memory device of FIG. 4.

FIG. 5 is a block diagram of a computer system 72 which includes the memory device 60 of FIG. 4. The computer system 72 includes computer circuitry 74 for performing various computing functions, such as executing specific software to perform specific calculations or tasks. In addition, the computer system 72 includes one or more input devices 76, such as a keyboard or a mouse, coupled to the computer circuitry 74 to allow an operator to interface with the computer system. Typically, the computer system 72 also includes one or more output devices 78 coupled to the computer circuitry 74, such output devices typically being a printer or a video terminal. One or more data storage devices 80 are also typically coupled to the computer circuitry 74 to store data or retrieve data from external storage media (not shown). Examples of typical storage devices 80 include hard and floppy disks, tape cassettes, and compact disc read-only memories (CD-ROMs). The computer circuitry 74 is typically coupled to the memory device 60 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

We claim:

1. A programming circuit for programming an anti-fuse having first and second terminals, the programming circuit and the anti-fuse being fabricated in an integrated circuit, comprising:

a first terminal of the integrated circuit coupled to the first terminal of the anti-fuse, the first terminal adapted to receive a first programming voltage having a positive polarity;

a second external terminal of the integrated circuit adapted to receive a second programming voltage having a negative polarity: and a voltage translation circuit coupled between the second external terminal and the second terminal of the anti-fuse and having an enable terminal adapted to receive an enable signal, the voltage translation circuit operable to couple the second programming voltage to the second terminal of the anti-fuse in response to the enable signal being active, and to isolate positive and negative voltages on the second external terminal from the second terminal of the anti-fuse when the enable signal is inactive.

2. The circuit of claim 1 wherein the first programming voltage is applied to the first terminal from a source external to the integrated circuit.

3. The circuit of claim 1 wherein there is substantially no voltage drop across the voltage translation circuit so that substantially the full magnitude of the second programming voltage on the second external terminal is applied to the second terminal of the anti-fuse.

4. A programming circuit for programming an anti-fuse having first and second terminals, the programming circuit and the anti-fuse being fabricated in the same integrated circuit, comprising:

a first terminal of the integrated circuit coupled to the first terminal of the anti-fuse, the first terminal adapted to receive a first programming voltage having a predetermined polarity;

a second external terminal of the integrated circuit adapted to receive a second programming voltage having a polarity opposite that of the first programming voltage; and a voltage translation circuit coupled between the second external terminal and the second terminal of the anti-fuse and having an enable terminal adapted to receive an enable signal, the voltage translation circuit operable to couple the second programming voltage to the second terminal of the anti-fuse in response to the enable signal being active and to isolate positive and negative voltages on the second external terminal from the second terminal of the anti-fuse when the enable signal is inactive, the voltage translation circuit including, a control circuit which operates to couple the second external terminal to a pass terminal when the enable signal is active and to couple the second external terminal to a control terminal when the enable signal is inactive to thereby provide the second programming voltage on the pass and control terminals, respectively;

a pass circuit having an input terminal coupled to the pass terminal and an output terminal coupled to the second terminal of the anti-fuse, the pass circuit operable to couple the input terminal to the output terminal when the enable signal is active; and a reset circuit coupled to the enable terminal and the control terminal and having a reset terminal coupled to the input terminal of the pass circuit, the reset circuit operable to drive the reset terminal to a reference voltage when the enable signal is inactive and the control circuit provides the second programming voltage on the control terminal, and operable to isolate the reset terminal when the enable signal is inactive.

5. The circuit of claim 4 wherein the control circuit comprises:

a PMOS transistor having gate, source, and drain terminals, the enable terminal coupled through an inverter to the gate terminal and the source terminal coupled to a positive supply voltage;

a first NMOS transistor having gate, source, and drain terminals, the gate terminal coupled to the gate terminal of the PMOS transistor and the drain terminal coupled to the drain of the PMOS transistor; and a second NMOS transistor having gate, source, and drain terminals, the gate terminal coupled to the drain terminal of the PMOS transistor, the drain terminal coupled to source terminal of the first NMOS transistor, and the source terminal coupled to input terminal of the pass circuit.

6. The circuit of claim 4 wherein the pass circuit comprises an NMOS transistor.

7. The circuit of claim 4 wherein the reset circuit comprises a PMOS transistor having a gate terminal coupled to the control terminal and an NMOS transistor having the enable terminal coupled through an inverter to a gate terminal, the PMOS and NMOS transistors having source and drain terminals connected, respectively, in series between the reset terminal and the common voltage reference.

8. A programming circuit for programming an anti-fuse having first and second terminals, the programming circuit and the anti-fuse being fabricated in the same integrated circuit, comprising:

a first terminal of the integrated circuit coupled to the first terminal of the anti-fuse, the first terminal adapted to receive a positive programming voltage;

an external terminal of the integrated circuit adapted to receive a negative programming voltage;

an enable terminal adapted to receive an enable signal; and a voltage translation circuit coupled to the external terminal, the enable terminal, and the second terminal of the anti-fuse, comprising, a control circuit which operates to couple the external terminal to a pass terminal when the enable signal is active and to couple the external terminal to a control terminal when the enable signal is inactive to thereby provide the negative programing voltage on the pass and control terminals, respectively, a pass circuit having an input terminal coupled to the pass terminal and an output terminal coupled to the second terminal of the anti-fuse, the pass circuit operable to couple the input terminal to the output terminal when the enable signal is active, and a reset circuit having a reset terminal coupled to the input terminal of the pass circuit, operable in a first mode to drive the reset terminal to a reference voltage when the enable signal is inactive and the control circuit provides the negative programming voltage on the control terminal, and operable in a second mode to provide a high impedance at the reset terminal when the enable signal is active and no negative programming voltage is provided on the control terminal.

9. The circuit of claim 8 wherein the control circuit comprises:

a PMOS transistor having gate, source, and drain terminals, the enable terminal coupled through an inverter to the gate terminal and the source terminal coupled to a positive supply voltage;

a first NMOS transistor having gate, source, and drain terminals, the gate terminal coupled to the gate terminal of the PMOS transistor and the drain terminal coupled to the drain of the PMOS transistor; and a second NMOS transistor having gate, source, and drain terminals, the gate terminal coupled to the drain terminal of the PMOS transistor, the drain terminal coupled to source terminal of the first NMOS transistor, and the source terminal coupled to input terminal of the pass circuit.

10. The circuit of claim 8 wherein the pass circuit comprises an NMOS transistor.

11. The circuit of claim 8 wherein the reset circuit comprises a PMOS transistor having a gate terminal coupled to the control terminal and an NMOS transistor having the enable terminal coupled through an inverter to a gate terminal, the PMOS and NMOS transistors having source and drain terminals connected in series, respectively, between the reset terminal and the reference voltage.

12. A dynamic random access memory, comprising:

an address bus;

a control bus;

a data bus;

an address decoder coupled to the address bus;

a control circuit coupled the control bus;

a read/write circuit coupled to the data bus;

a memory-cell array coupled to the address decoder, control circuit, and read/write circuit; and a programming circuit for programming an anti-fuse having first and second terminals, comprising, a first terminal of the dynamic random access memory coupled to the first terminal of the anti-fuse, the first external terminal adapted to receive a first programming voltage having a positive polarity, a second external terminal of the dynamic random access memory adapted to receive a second programming voltage having a negative polarity, and a voltage translation circuit coupled between the second external terminal and the second terminal of the anti-fuse and having an enable terminal adapted to receive an enable signal, the voltage translation circuit operable to couple the second programming voltage to the second terminal of the anti-fuse in response to the enable signal being active and to isolate positive and negative voltages on the second external terminal from the second terminal of the anti-fuse when the enable signal is inactive.

13. A dynamic random access memory, comprising:

an address bus;

a control bus;

a data bus;

an address decoder coupled to the address bus;

a control circuit coupled the control bus;

a read/write circuit coupled to the data bus;

a memory-cell array coupled to the address decoder, control circuit, and read/write circuit, and a programming circuit for programming an anti-fuse having first and second terminals, comprising, a first external terminal of the dynamic random access memory coupled to the first terminal of the anti-fuse, the first external terminal adapted to receive a first programming voltage having a predetermined polarity, a second external terminal of the dynamic random access memory adapted to receive a second programming voltage having a polarity opposite that of the first programming voltage, and a voltage translation circuit coupled between the second external terminal and the second terminal of the anti-fuse and having an enable terminal adapted to receive an enable signal, the voltage translation circuit operable to couple the second programming voltage to the second terminal of the anti-fuse in response to the enable signal being active and to isolate positive and negative voltages on the second external terminal from the second terminal of the anti-fuse when the enable signal is inactive, the voltage translation circuit comprising, a control circuit which operates to couple the second external terminal to a pass terminal when the enable signal is active and to couple the second external terminal to a control terminal when the enable signal is inactive to thereby provide the second programming voltage on the pass and control terminals, respectively, a pass circuit having an input terminal coupled to the pass terminal and an output terminal coupled to the second terminal of the anti-fuse, the pass circuit operable to couple the input terminal to the output terminal when the enable signal is active, and a reset circuit having a reset terminal coupled to the input terminal of the pass circuit, operable in a first mode to drive the reset terminal to a reference voltage when the enable signal is inactive and the control circuit provides the negative programming voltage on the control terminal, and operable in a second mode to provide a high impedance at the reset terminal when the enable signal is active and no negative programming voltage is provided on the control terminal.

14. The dynamic random access memory of claim 13 wherein the control circuit comprises:

a PMOS transistor having gate, source, and drain terminals, the enable terminal coupled through an inverter to the gate terminal and the source terminal coupled to a positive supply voltage;

a first NMOS transistor having gate, source, and drain terminals, the gate terminal coupled to the gate terminal of the PMOS transistor and the drain terminal coupled to the drain of the PMOS transistor; and a second NMOS transistor having gate, source, and drain terminals, the gate terminal coupled to the drain terminal of the PMOS transistor, the drain terminal coupled to source terminal of the first NMOS transistor, and the source terminal coupled to input terminal of the pass circuit.

15. The dynamic random access memory of claim 14 wherein the pass circuit comprises an NMOS transistor.

16. The dynamic random access memory of claim 13 wherein the reset circuit comprises a PMOS transistor having a gate terminal coupled to the control terminal and an NMOS transistor having the enable terminal coupled through an inverter to a gate terminal, the PMOS and NMOS transistors having source and drain terminals connected, respectively, in series between the reset terminal and the common voltage reference.

17. The dynamic random access memory of claim 12 wherein each memory cell comprises:

a storage element having a first storage terminal and a second storage terminal, the second storage terminal coupled to a reference voltage source of approximately $V_{CC}/2$; and a memory switch circuit having a control terminal coupled to an associated row line, a first data terminal coupled to the first storage terminal of the storage element, and a second data terminal coupled to one of the associated first and second complementary digit lines.

18. A computer system, comprising:

a data input device;

a data output device; and computing circuitry coupled to the data input and output devices, the computing circuitry including a memory device that includes a programming circuit for programming an anti-fuse having first and second terminals, the programming circuit and the anti-fuse being fabricated in the same integrated circuit, comprising, a first terminal of the integrated circuit coupled to the first terminal of the anti-fuse, the first terminal adapted to receive a first programming voltage having a positive polarity, a second external terminal of the integrated circuit adapted to receive a second programing voltage having a negative polarity; and a voltage translation circuit coupled between the second external terminal and the second terminal of the anti-fuse and having an enable terminal adapted to receive an enable signal, the voltage translation circuit operable to couple the second programming voltage to the second terminal of the anti-fuse in response to the enable signal being active and to isolate positive and negative voltages on the second external terminal from the second terminal of the anti-fuse when the enable signal is inactive.

19. A method for programming an anti-fuse having first and second terminals, comprising:

applying a first programming voltage having a positive polarity to the first terminal of the anti-fuse;

applying a second programming voltage having a negative polarity to an external terminal of an integrated circuit containing the anti-fuses; and coupling the second programming voltage to the second terminal of the anti-fuse in a first operating mode and isolating positive and negative voltages on the external terminal from the second terminal of the anti-fuse in a second operating mode.

20. The method of claim 19 wherein the step of applying a first programming voltage includes the step of applying the first programming voltage to the first terminal of the anti-fuse from a source external to the integrated circuit.

21. The method of claim 19 wherein the step of applying a first programming voltage includes the step of applying a first programming voltage having a positive polarity.

22. The method of claim 19 wherein the step of applying a second programming voltage includes the step of applying a second programming voltage having a negative polarity.

23. The method of claim 19 wherein the step of coupling the second programming voltage includes the steps of:

coupling the external terminal to a pass node in the first operating mode;

coupling the external terminal to a control node in the second operating mode;

coupling the pass node to the second terminal of the anti-fuse in the first operating mode;

isolating the pass node from the second terminal of the anti-fuse in the second operating mode;

coupling the pass node to a reference voltage in the second operating mode; and isolating the pass node from the reference voltage in the first operating mode.

* * * * *